United States Patent [19]
Sommer et al.

[11] Patent Number: 6,051,512
[45] Date of Patent: *Apr. 18, 2000

[54] APPARATUS AND METHOD FOR RAPID THERMAL PROCESSING (RTP) OF A PLURALITY OF SEMICONDUCTOR WAFERS

[75] Inventors: Helmut Sommer, Deggingen; Manuela Zwissler, Neu-Ulm; Herbert Kegel, Blaustein, all of Germany

[73] Assignee: Steag RTP Systems, Dornstadt, Germany

[*] Notice: This patent issued on a continued prosecution application filed under 37 CFR 1.53(d), and is subject to the twenty year patent term provisions of 35 U.S.C. 154(a)(2).

[21] Appl. No.: 08/838,627
[22] Filed: Apr. 11, 1997
[51] Int. Cl.[7] ................................................. H03L 21/324
[52] U.S. Cl. ........................ 438/795; 438/799; 219/390; 219/405; 118/725
[58] Field of Search ........................... 29/25.01; 438/795, 438/799, 507; 414/147, 149, 940; 219/390, 405; 118/725

[56] References Cited

U.S. PATENT DOCUMENTS

| 5,445,676 | 8/1995 | Takagi ................................. 118/725 |
| 5,710,407 | 1/1998 | Moore et al. ........................ 118/725 |

*Primary Examiner*—Donald L. Monin, Jr.
*Assistant Examiner*—Michael Dietrich
*Attorney, Agent, or Firm*—Rodney T Hodgson

[57] ABSTRACT

A plurality of substrates is closely stacked together in a Rapid Thermal Processing (RTP) chamber, and the stack is processed simultaneously.

14 Claims, 4 Drawing Sheets

APPARATUS AND METHOD FOR RAPID THERMAL PROCESSING (RTP) OF A PLURALITY OF SEMICONDUCTOR WAFERS

FIELD OF THE INVENTION

The present invention relates to a method and an apparatus for the rapid thermal processing (RTP) of sensitive electronic materials. The present invention allows high throughput of semiconductor wafers in an RTP machine.

BACKGROUND OF THE INVENTION

Rapid Thermal Processing (RTP) is a versatile optical heating method which can be used for semiconductor processing as well as a general, well controlled, method for heating objects or wafers which are in the form of thin sheets, slabs, or disks. The objects are generally inserted one at a time into a chamber which has at least some portions of the chamber walls transparent to transmit radiation from powerful heating lamps. The transparent portion of the walls is generally quartz, which will transmit radiation up to a wavelength of 3 to 4 microns. These lamps are generally tungsten-halogen lamps, but arc lamps or any other source of visible and/or near infrared radiation may be used. The radiation from the lamps is directed through the transparent portions of the walls on to the flat surface of the object to be heated. Radiation may be directed on to the flat surface of the object from one side or the other, or both sides simultaneously. As long as the objects absorb light in the near infrared or visible spectral region transmitted by the transparent portion of the walls, RTP techniques allow fast changes in the temperature and process gas for the different material processes and conditions. Since the flat surface of a semiconductor wafer may be uniformly irradiated, the entire wafer may be heated with relatively little temperature difference across the wafer during the entire time of heating, and hence little slip occurs. RTP allows the "thermal budgets" of the various semiconductor processing to be reduced, as well as allows the production of various metastable states which can be "frozen in" when the material is cooled rapidly.

RTP systems are relatively new. In the last 10 or 15 years, such systems were used only in research and development. The thrust of the work was increasing the temperature uniformity, and developing heating cycles and processes which decreased the thermal budget. Prior art RTP machines can heat unstructured, homogeneous materials in the form of a flat plate or disk, and produce temperature uniformities across the plate adequate for semiconductor processing processes.

The temperature control in current RTP systems is mostly performed by monochromatic (or narrow wavelength band) pyrometry measuring temperature of the relatively unstructured and featureless backside of semiconductor wafers. The results of the temperature measurement are generally used in a feedback control to control the heating lamp power. Backside coated wafers with varying emissivity can not be used in this way, however, and the backside layers are normally etched away or the temperature is measured using contact thermocouples.

A newer method of temperature control is the power controlled open loop heating described in U.S. Pat. No. 5,359,693, which patent is hereby incorporated by reference.

German patent DE42 23 133 C2, hereby incorporated by reference, discloses a method of producing relatively defect free material in RTP machines. Apparatus induced thermal inhomogeneities have been reduced in the last few years because of the demand for more uniform processing. Among the techniques used have been control of the individual lamp power, use of circular lamps, and rotation of the semiconductor wafers with independent power control.

Most RTP machines have a thin rectangular quartz reaction chamber having one end open. Chambers meant for vacuum use often have a flattened oval cross section. Chambers could even be made in the form of a flat cylindrical pancake. In general, the chambers are used so that the thin objects to be heated are held horizontally, but they could also be held vertical or in any convenient orientation. The reactor chamber is usually thin to bring the lamps close to the object to be heated. The reactor chamber is opened and closed at one end with a pneumatically operated door when the wafer handling system is in operation. The door is usually made of stainless steel, and may have a quartz plate attached to the inside. The process gas is introduced into the chamber on the side opposite the door and exhausted on the door side. The process gas flow is controlled by computer controlled valves connected to various manifolds in a manner well known in the art.

In recent years, the "cost of ownership" (COO) has driven purchasing decisions for the semiconductor manufacturing industry. All costs, such as floor space costs, water and process gas costs, as well as capital cost for a particular process are divided by the number of wafers produced by the process. The throughput of a particular system is then of paramount importance, since doubling the throughput without doubling the capital cost or footprint or other needs of the process lowers the COO. However, the time needed for most RTP processes is mostly fixed by the physics of the process, and the throughput can only be increased by 30% by cutting the handling time for loading and unloading wafers to zero. It is thus of great importance to increase throughput of an RTP system without increasing the capital costs and footprint proportionally.

RELATED APPLICATIONS

Reactors based on the RTP principle often have the entire cross section of one end of the reactor chamber open during the wafer handling process. This construction has been established because the various wafer holders, guard rings, and gas distribution plates, which have significantly greater dimensions and may be thicker than the wafers, must also be introduced into the chamber and must be easily and quickly changed when the process is changed or when different wafer sizes, for example, are used. The reaction chamber dimensions are designed with these ancillary pieces in mind. Patent application Ser. No. 08/387,220, (now U.S. Pat. No. 5,580,830), assigned to the assignee of the present invention, hereby incorporated by reference, teaches the importance of the gas flow and the use of an aperture in the door to regulate gas flow and control impurities in the process chamber.

The wafer to be heated in a conventional RTP system typically rests on a plurality of quartz pins which hold the wafer accurately parallel to the reflector walls of the system. Prior art systems have rested the wafer on an instrumented susceptor, typically a uniform silicon wafer. Copending patent application Ser. No. 08/537,409, (now U.S. Pat. No. 5,861,609), assigned to the assignee of the present invention, hereby incorporated by reference, teaches the importance susceptor plates separated from the wafer.

Rapid thermal processing of III-IV semiconductors has not been as successful as RTP of silicon. One reason for this is that the surface has a relatively high vapor pressure of, for example, arsenic (As) in the case of gallium arsenide (GaAs). The surface region becomes depleted of As, and the material quality suffers. Copending patent application Ser. No. 08/631,265, (now U.S. Pat. No. 5,837,555),assigned to the assignee of the present invention, hereby incorporated by reference, supplies a method and apparatus for overcoming this problem.

OBJECTS OF THE INVENTION

It is an object of the invention to provide an improved rapid thermal processing (RTP) apparatus, method and system which increases the throughput of semiconductor wafers processed in the RTP system..

It is an object of the invention to provide a rapid thermal processing system which is capable of rapid turnaround of semiconductor wafers and high throughput of processed wafers with good repeatability.

SUMMARY OF THE INVENTION

Two or more semiconductor wafers are loaded into the RTP system, and processed at the same time. The wafers may be loaded sequentially or loaded at the same time. The infrared radiation radiated from the wafers which causes deleterious heating of the quartz walls of the RTP chamber is increased much less than the throughput of the system.

DETAILED DESCRIPTION OF THE INVENTION

Figure 1:
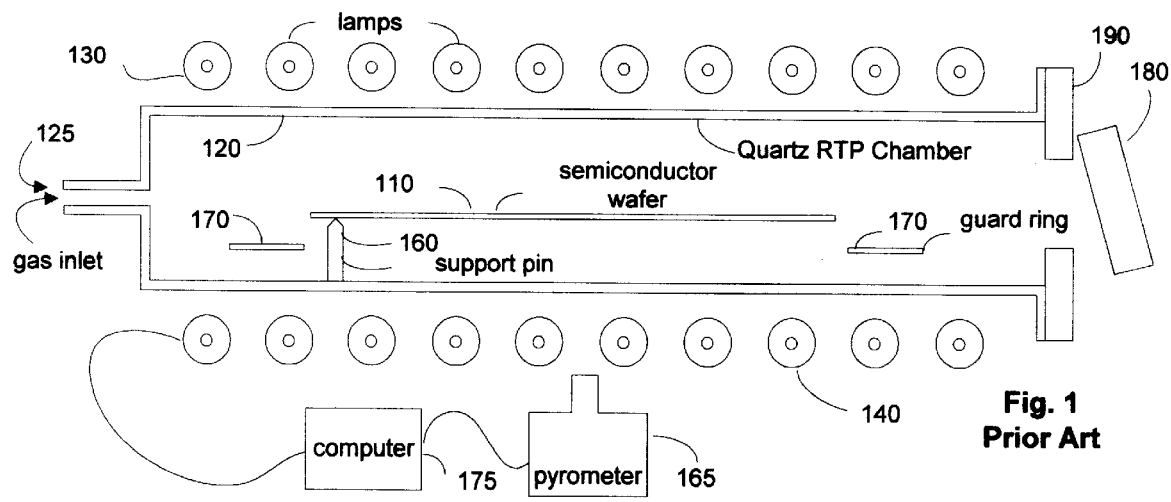
FIG. 1 is a sketch of a prior art open ended quartz reactor chamber RTP system with two banks of heating lamps.

FIG. 1 is a sketch of a prior art RTP chamber 120 containing single substrate or wafer 110 supported in position for RTP by quartz support pins 160 (only one shown). The chamber 120 is generally made of quartz or other transparent material to allow visible and infrared light from an upper bank of heating lamps 130 to heat the flat side of the wafer 110. A lower bank of lamps 140 is also shown, and one or the other or both banks may be used in different systems. One end 190 of the chamber 160 may be removed to allow insertion of the support pins 160 and a base (not shown) holding the support pins in place. A door 180 allows introduction of the wafer 110 for processing and an exit for process gas introduced in a gas inlet 125. A ring of material 170 may optionally be placed in the chamber to guard against slip lines induced in the wafer 110 by non uniform heating of the wafer. A temperature measurement device such as a pyrometer 165 is used to monitor the wafer temperature during processing. The entire device may be controlled by a computer 175, which measures the temperature and controls the power to the various lamps 140 and 130. Prior art systems use the light transmitted through the chamber walls which falls substantially normally on to the flat surface of one thin, plate shaped substrate to heat the substrate to a temperature necessary for Rapid Thermal Processing, which may be annealing, chemical vapor deposition, or many other processes known in the art.

Figure 2:
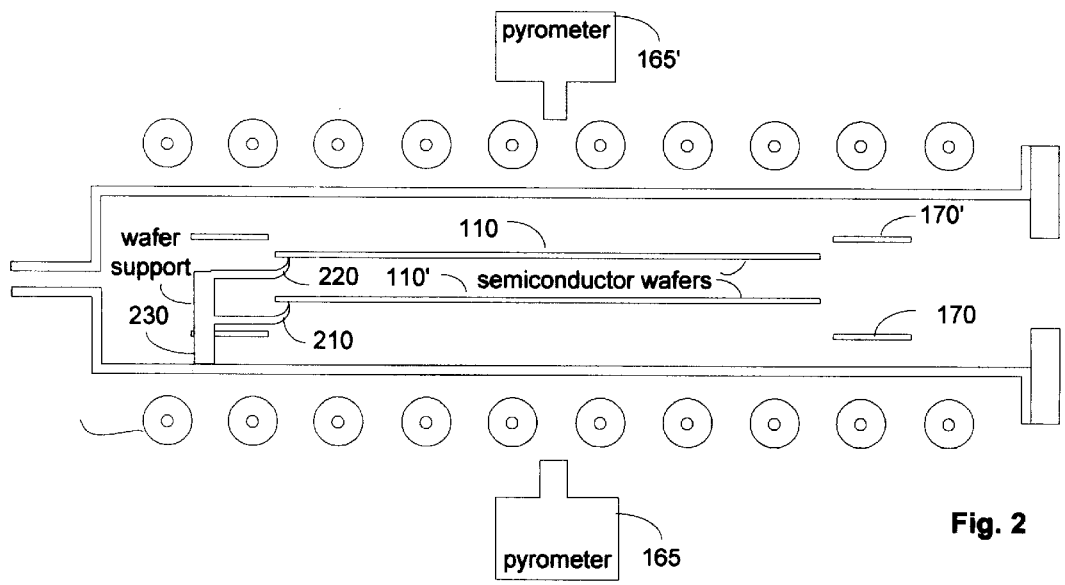
FIG. 2 is a sketch of the most preferred embodiment of the invention.

FIG. 2 shows the apparatus used in the method of the invention. Two wafers 110 and 110' are supported by wafer supports 230 (only one shown) and processed simultaneously in the apparatus. The temperature of each wafer can be monitored separately, for example with two pyrometers 165 and 165', and the heating lamps can be controlled to ensure that each wafer has the same time temperature profile (if needed for identical wafers). Each wafer radiates a substantial amount of infrared radiation during the processing, and as the wafers are in a closely spaced apart, stacked relationship with each other, the radiation from each wafer is partially used to heat the other wafer. The infrared radiation heating the quartz walls of the reactor 120 from the two wafers shown in FIG. 2 is little more than would be radiated from the single wafer shown in FIG. 1, so the heat load on the quartz walls is not greatly increased and the cooling gas needed to cool the quartz walls is not greatly increased. In FIG. 2, two optional slip guard rings 170 and 170' are shown surrounding the wafers 110 and 110'.

Figure 3A:
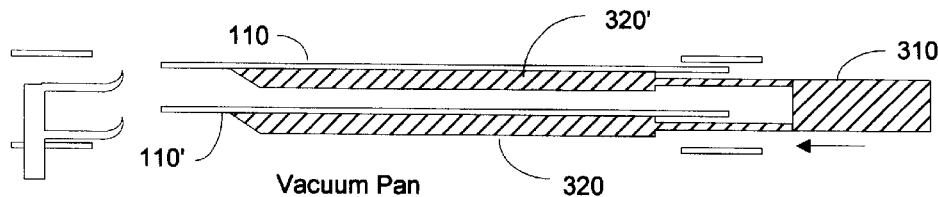
FIGS. 3a–b are sketches of operational steps of a preferred method of the invention.
Figure 3B:
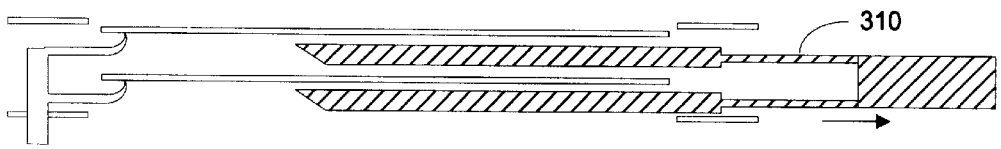

FIG. 3a shows a sketch one step of a preferred method of the invention, wherein a robot arm 310 carrying two vacuum support pans 320 and 320', which support two wafers 110 and 110'respectively, as the robot arm carries the wafers into the processing chamber (not shown). FIG. 3b shows the robot arm 310 withdrawing from the chamber leaving the two wafers supported by the wafer support 230 (only one shown). After the wafers have been processed, the robot arm 310 brings the vacuum pans 320 and 320' in the reverse direction shown in FIG. 3b under the wafers, lifts the wafers from the wafer supports, and withdraws carrying the wafers.

Figure 4:
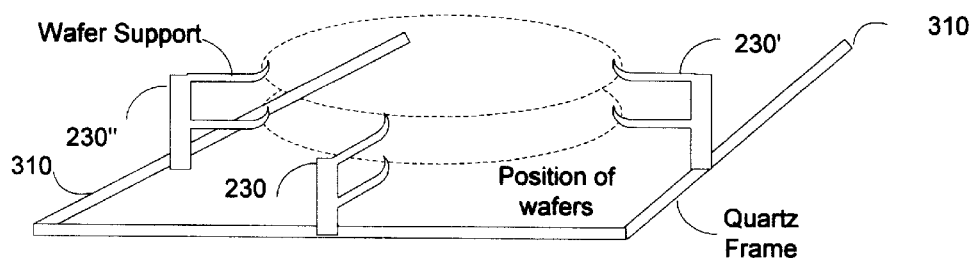
FIG. 4 is a sketch of the support frame for wafers in FIGS. 3a–b.

FIG. 4 shows a perspective sketch of three wafer supports 230, 230' and 230" supported by a quartz frame 310 which is in turn supported by the processing chamber 120. The position of the wafers is shown by the dotted lines in FIG. 4.

Figure 5A:
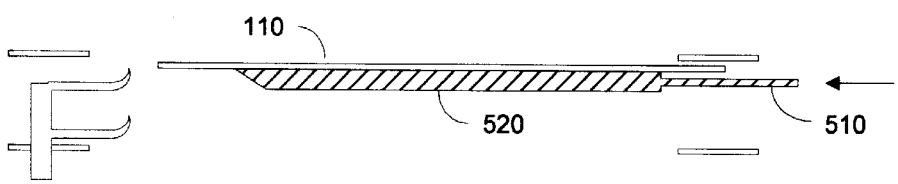
FIGS. 5a–d are sketches of operational steps of a preferred method of the invention.
Figure 5B:
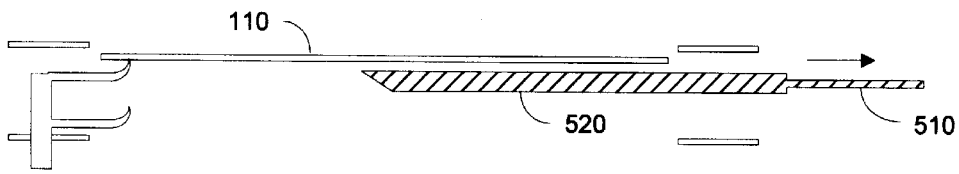
Figure 5C:
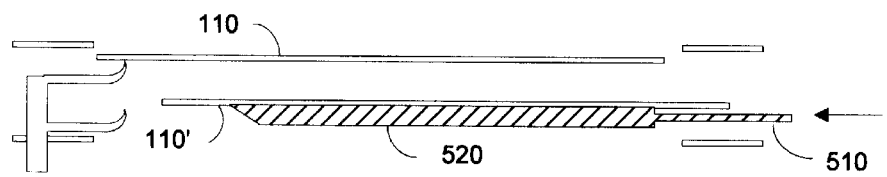
Figure 5D:
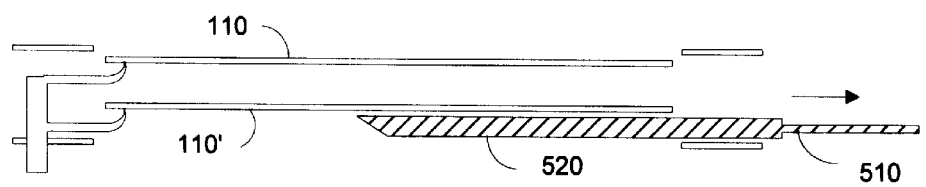

FIGS. 5a–d are sketches of the steps needed to carry out the method of the invention if the wafers are loaded into the chamber sequentially. FIG. 5a, shows the wafer 110 carried by a single vacuum pan 520 on a robot arm 510 as the wafer is being introduced into the chamber (not shown). The robot arm lowers the wafer 110 on to the wafer supports (only one shown), and withdraws as shown in FIG. 5b. The same or another robot arm 510 may then carry a second wafer 110' into the chamber as shown in FIG. 5c. The robot arm 510 then lowers the wafer 110' on to the wafer supports (only one shown), and withdraws as shown in FIG. 5b.

Figure 6:
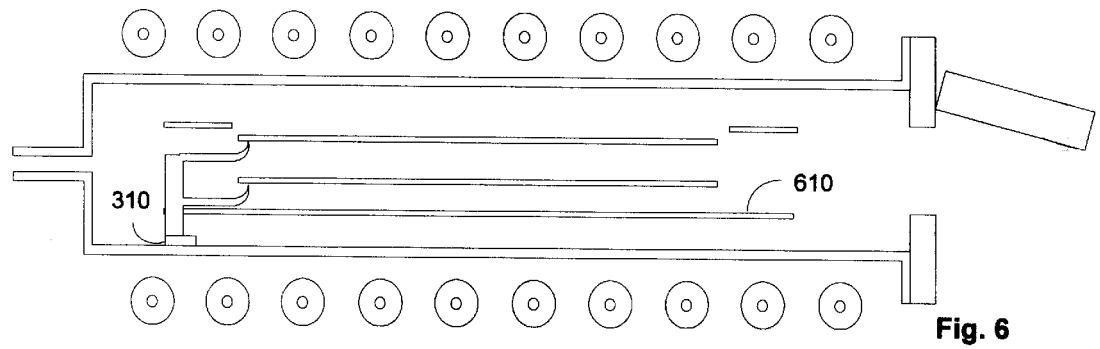
FIG. 6 is a sketch of a preferred embodiment of the invention.

FIG. 6 shows a sketch of an RTP chamber having two wafers in position for processing, and also including an optional susceptor 610 closely spaced apart from a wafer. Such a susceptor has been shown to be valuable in RTP.

Figure 7:
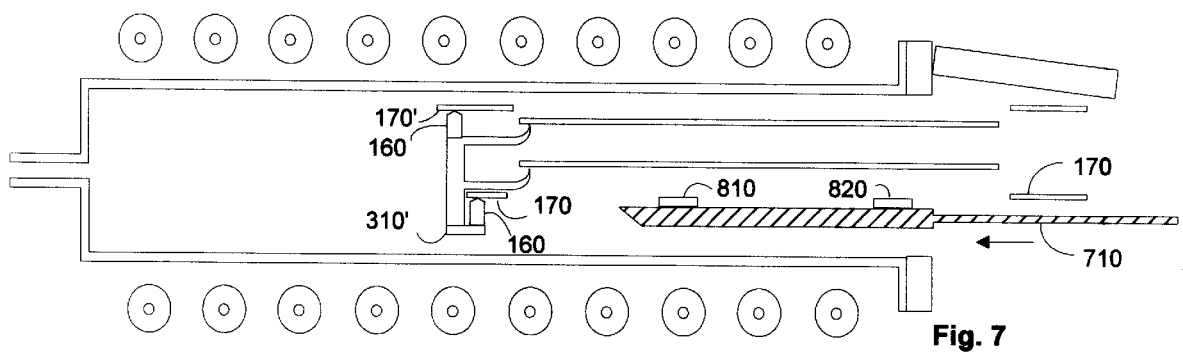
FIG. 7 is a sketch of a preferred embodiment of the method of the invention.

FIG. 7 shows a sketch of the most preferred method of the invention, wherein all the wafers, support pins, guard rings, susceptors, etc. are picked up together and moved into the chamber of the RTP system. FIG. 7 shows the robot arm holding the frame 310', which is supported by frame lifting struts 810 and 820 (details shown later). The wafers and support elements may be assembled outside the chamber as another set of wafers is processed. Then a robot arm may remove the entire assembly which has been processed, and the same or another robot arm may introduce the next set of wafers to be processed. The robot arm may either enter and leave the chamber with a linear motion, or the robot arm may rotate and then lower the frame 310' on to the bottom half of a split apart RTP chamber.

Figure 8:
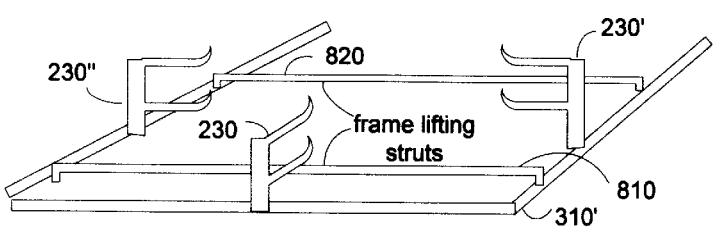
FIG. 8 is a sketch a support frame for the wafers of FIG. 7.

FIG. 8 shows a perspective sketch of a frame 310' with frame lifting struts 810 and 820.

Figure 9:
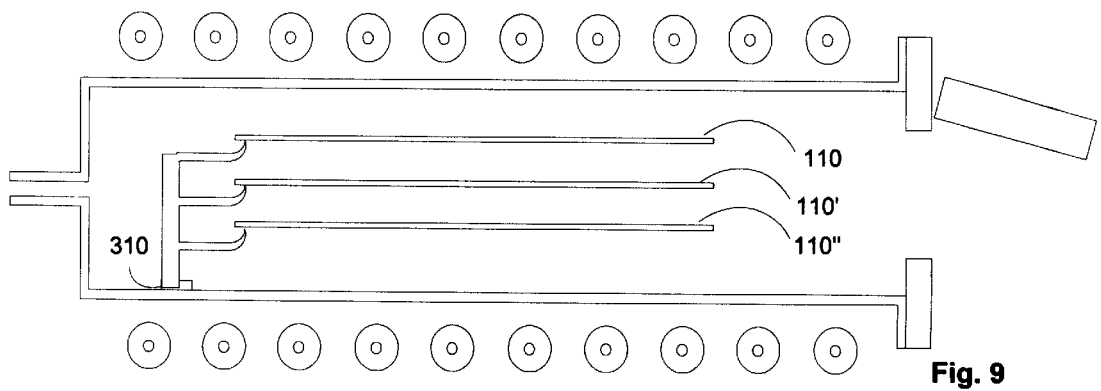
FIG. 9 is a sketch of a preferred embodiment of the invention.

FIG. 9 shows a sketch of a preferred embodiment of a stack of 3 closely spaced apart wafers 110, 110' and 110" supported in an RTP system for processing. The center wafer 110' is heated principally by infrared radiation from the outer wafers 110 and 110".

Figure 10A:
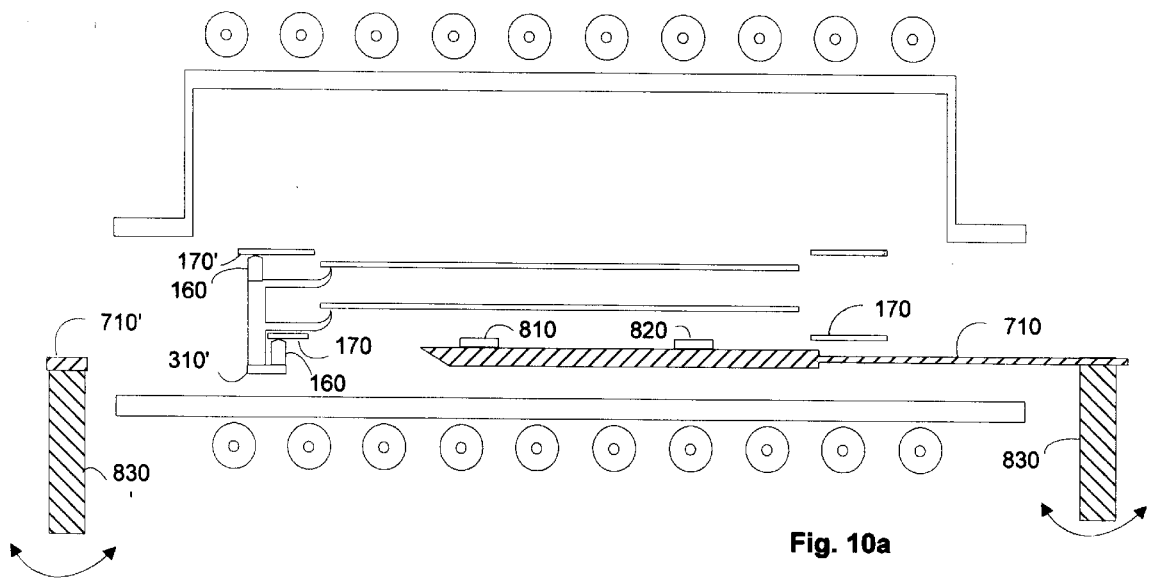
FIGS. 10a–b are sketches of a preferred embodiment of the invention.
Figure 10B:
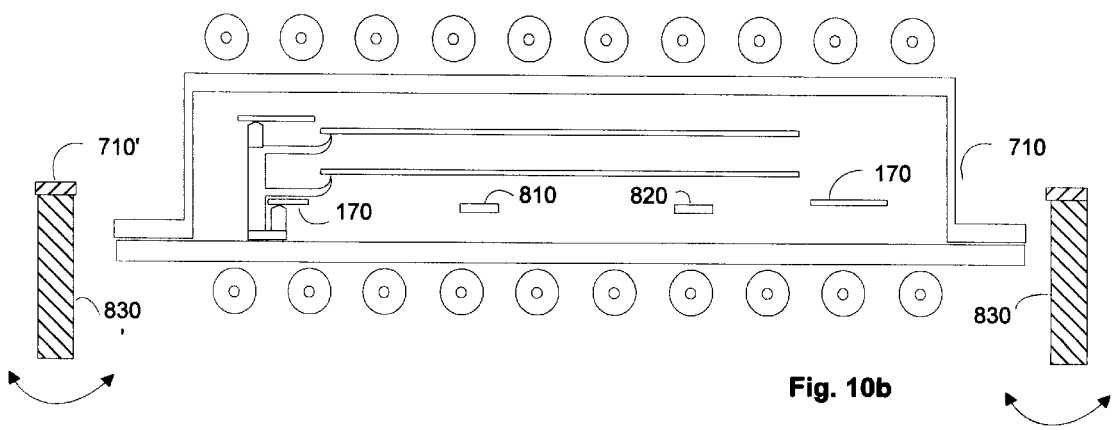

FIG. 10a–b are sketches of a preferred embodiment of the invention, whereby the RTP chamber is in the form of a bottom plate with a "top hat" upper plate. The upper plate and the upper lamps may be lifted to allow the entire wafer assembly to be rotated into place and lowered onto the bottom plate by the robot arm 710 which is now attached to a rotatable and translatable post 830. Also shown is an optional second assembly 830', whereby the loading and unloading operation may be speeded up by having one robot arm load one wafer assembly as the other robot arm is removing the already processed wafers.

We claim:

1. A method for rapid thermal processing (RTP) of a plurality of objects, the plurality of objects having substantially identical shapes, the shapes being substantially the shape of flat plates, the flat plates having a first surface, a second surface, and an edge, comprising;

introducing the plurality of objects into an RTP chamber so that each object is supported in a closely spaced apart stack; and processing the plurality of objects by uniformly irradiating a flat surface of each wafer.

2. The method of claim 1, wherein the plurality of objects are introduced simultaneously into the RTP chamber.

3. The method of claim 2, wherein the plurality of objects are a plurality of semiconductor wafers.

4. The method of claim 3, wherein, during the step of introducing the semiconductor wafers into the RTP chamber, the semiconductor wafers are supported by support means used to support the semiconductor wafers during the processing step.

5. The method of claim 4, wherein, during the step of introducing the semiconductor wafers into the RTP chamber, a guard ring surrounding the stack of semiconductor wafers is also introduced into the RTP chamber.

6. The method of claim 4, wherein, during the step of introducing the semiconductor wafers into the RTP chamber, a susceptor closely spaced apart from the stack of semiconductor wafers is also introduced into the RTP chamber.

7. The method of claim 4, wherein, during the step of introducing the semiconductor wafers into the RTP chamber, the semiconductor wafers are introduced into the chamber by a linear motion of a robot arm.

8. The method of claim 4, wherein, during the step of introducing the semiconductor wafers into the RTP chamber, the semiconductor wafers are introduced into the chamber by a rotary motion of a robot arm.

9. The method of claim 3, wherein each semiconductor wafer is supported by a different support pan in the step of introducing the semiconductor wafers into the RTP chamber, and where all of the support pans are supported by a single robot arm.

10. The method of claim 2, wherein each semiconductor wafer is supported by a different support pan in the step of introducing the semiconductor wafers into the RTP chamber, and each support pan is supported by different robot arm.

11. The method of claim 1, wherein the plurality of objects are introduced into the chamber sequentially.

12. The method of claim 1, wherein the plurality of objects are not identical.

13. The method of claim 1, wherein the temperature of at least two of the objects are monitored during the processing step.

14. The method of claim 13, wherein the temperature of each of the plurality of objects are monitored during the processing step.

* * * * *